United States Patent [19]

Wang et al.

[11] Patent Number: 5,740,074
[45] Date of Patent: Apr. 14, 1998

[54] METHOD FOR FILLING A COMPARTMENT CAVITY WITH FOAM

[75] Inventors: Hsin-Pang Wang, Rexford; Erin Marie Perry, Niskayuna; Harold John Jenkins, Jr., Amsterdam, all of N.Y.

[73] Assignee: General Electric Company, Schenectady, N.Y.

[21] Appl. No.: 751,043

[22] Filed: Nov. 15, 1996

Related U.S. Application Data

[60] Provisional application No. 60/022,952 Aug. 1, 1996.
[51] Int. Cl.$^6$ ........................................ C06F 17/50
[52] U.S. Cl. .................................... 364/500; 364/578
[58] Field of Search ............................ 364/500, 496, 364/578, 510, 550, 468.04, 468.25, 468.26, 475.05, 475.09

[56] References Cited

U.S. PATENT DOCUMENTS 5,572,434 11/1996 Wang et al. ................ 364/578 X

OTHER PUBLICATIONS

Pertsov et al., "Plateau–Gibbs Borders: Calculation of Shape, Volume, and Transport Parameters", Colloid Journal, vol. 57, n. 5, pp. 673–677 Sep. 1995.

Baser et al., "Modeling of the Dynamics of Water and R–11 Blown Polyurethane Foam Formation", Polymer Engineering and Science, vol. 34, n. 8, pp. 642–649 Apr. 1994.

"Numerical Techniques for Free and Moving Boundary Problems", by H. P. Wang and H. S. Lee, *Fundamentals of Computer Modeling for Polymer Processing*, Tucker, C.L. (ed), Hanser Publishers, New York, 1989, pp. 340–401.

"An Integrated Approach for Modeling the Injection, Compression, and Resin Transfer Molding Processes for Polymers", by Erwin W. Liang, H.P. Wang and Erin M. Perry, *Advances in Polymer Technology*, vol. 12, No. 3, John Wiley & Sons, Inc., 1993, pp. 243–262.

*Primary Examiner*—Emanuel T. Voeltz
*Assistant Examiner*—M. Kemper
*Attorney, Agent, or Firm*—Douglas E. Erickson; Marvin Snyder

[57] ABSTRACT

A method for filling a compartment cavity, such as a refrigerative unit cavity, with a foam produced by an expansion and solidification of a foaming mixture of predetermined chemicals. A known amount of the foaming mixture is created in a test chamber cavity and preselected parameters (such as free surface height and pressure) are measured to obtain the average density and apparent viscosity of the foam as a function of time. A computer program uses the average density and apparent viscosity data to simulate the foaming process for various starting quantifies and starting locations of the foaming mixture. A preferred quantity and location are chosen from a particular computer run which satisfies predetermined fill criteria. The preferred quantity of the foaming mixture is then created at the preferred location in the compartment cavity.

11 Claims, 3 Drawing Sheets

METHOD FOR FILLING A COMPARTMENT CAVITY WITH FOAM

This application claims priority of a Provisional Application entitled "Development Of A Semi-Empirical Methodology To Characterize And Model The Polyurethane Foaming Process" by Hsin-Pang Wang et al., Ser. No. 60/022.952 filed Aug. 1, 1996.

BACKGROUND OF THE INVENTION

The present invention relates generally to predetermined chemicals which, when mixed, expand into a foam and then solidify, and more particularly to a method for filling a compartment cavity with such a foam.

Foams which are created by the expansion and solidification of a foaming mixture of chemicals include, but are not limited to, polypethane foam. Uses for such foams include, without limitation, serving as thermal insulation in a compartment cavity such as the space within a double-wall of a cabinet of a refrigerative unit such as a home refrigerator or freezer. Known methods for filling the space within the double-wall of a refrigerator cabinet with polyurethane foam include mixing a predetermined amount of the starting chemicals and injecting them at a predetermined location within the double-wall of the cabinet from which location the foaming process essentially begins. The foaming mixture then expands within the double-wall of the cabinet flowing throughout and between the double-wall of the cabinet's two exterior side panels, exterior top panel, exterior bottom panel, exterior back panel, and any interior rib panel. Before the start of the fill process, a venting hole is created at a predetermined location in the compartment cavity to release air trapped ahead of the advancing foam. Other venting holes may be required at different predetermined locations to avoid being l eft with any pockets of trapped air, such undesirable pockets being regions which can not be filled with foam. Preheating of a compartment cavity may be necessary to increase the activity of the foaming mixture to flow throughout the cavity. The predetermined amount of the starting chemicals, the predetermined location to which the mixed starting chemicals are injected, and the number and predetermined locations of venting holes are all determined by trial and error experiments involving actual entire refrigerator cabinets which are filled with foam and then torn apart to see how well the foam filled the cavity. Such experiments are repeated until a predetermined fill criteria is achieved. New experiments need to be performed for any change in geometry of the cabinet and/or any change in the chemical composition of the foam. What is needed is an improved method for filling a compartment cavity with foam, such as filling the space within the double-wall of a refrigerator cabinet with polyurethane thermal insulation.

SUMMARY OF THE INVENTION

It is an object of the invention to provide a method for filling a compartment cavity with foam.

The method of the invention is for filling a compartment cavity having a known geometry with a foam produced by an expansion and solidification of a foaming mixture of predetermined chemicals. The method includes steps a) through f). Step a) includes creating a known amount of the foaming mixture in a test-chamber cavity. Step b) includes measuring as a function of time preselected parameters of the foam produced by the foaming mixture created in step a) to obtain the average density and apparent viscosity of the foam as a function of time. Step c) includes running a computer program which utilizes the average density and apparent viscosity of the foam as a function of time obtained in step b) to mathematically simulate the expansion of the foam as a function of time of a prechosen quantity of the foaming mixture created at a prechosen location in an enclosure cavity having the same geometry as the known geometry of the compartment cavity. Step d) includes repeating step c) for various different prechosen quantities and various different prechosen locations. Step e) includes choosing a preferred quantity and preferred location from the prechosen quantities and prechosen locations of a particular computer run from steps c) and d) which satisfies predetermined fill criteria. Step f) includes creating the preferred quantity of the foaming mixture at the preferred location in the compartment cavity.

A preferred method includes, before step f), the step of creating a first vent hole in the compartment cavity at a first site which is last to be filled with the foam as determined from the particular computer run chosen in step e).

Several benefits and advantages are derived from the method of the invention. The method determines the preferred quantity and preferred starting location of the foaming mixture for a complete and uniform foam fill of the compartment cavity, as well as any vent hole sites, using a semi-empirical methodology. For a particular foam chemistry, this substantially reduces the number of experiments that need to be performed, where these experiments consist of filling and tearing down actual refrigerator cabinets to determine the extent of fill. Changes in geometry of a compartment cavity, for the same foam chemistry, are easily accounted for by new runs of the computer program without having to experimentally fill and tear down new refrigerator cabinets having the new geometry.

BRIEF DESCRIPTION OF THE DRAWINGS

The accompanying drawings illustrate the present invention wherein.

DETAILED DESCRIPTION OF THE INVENTION

Figure 1:
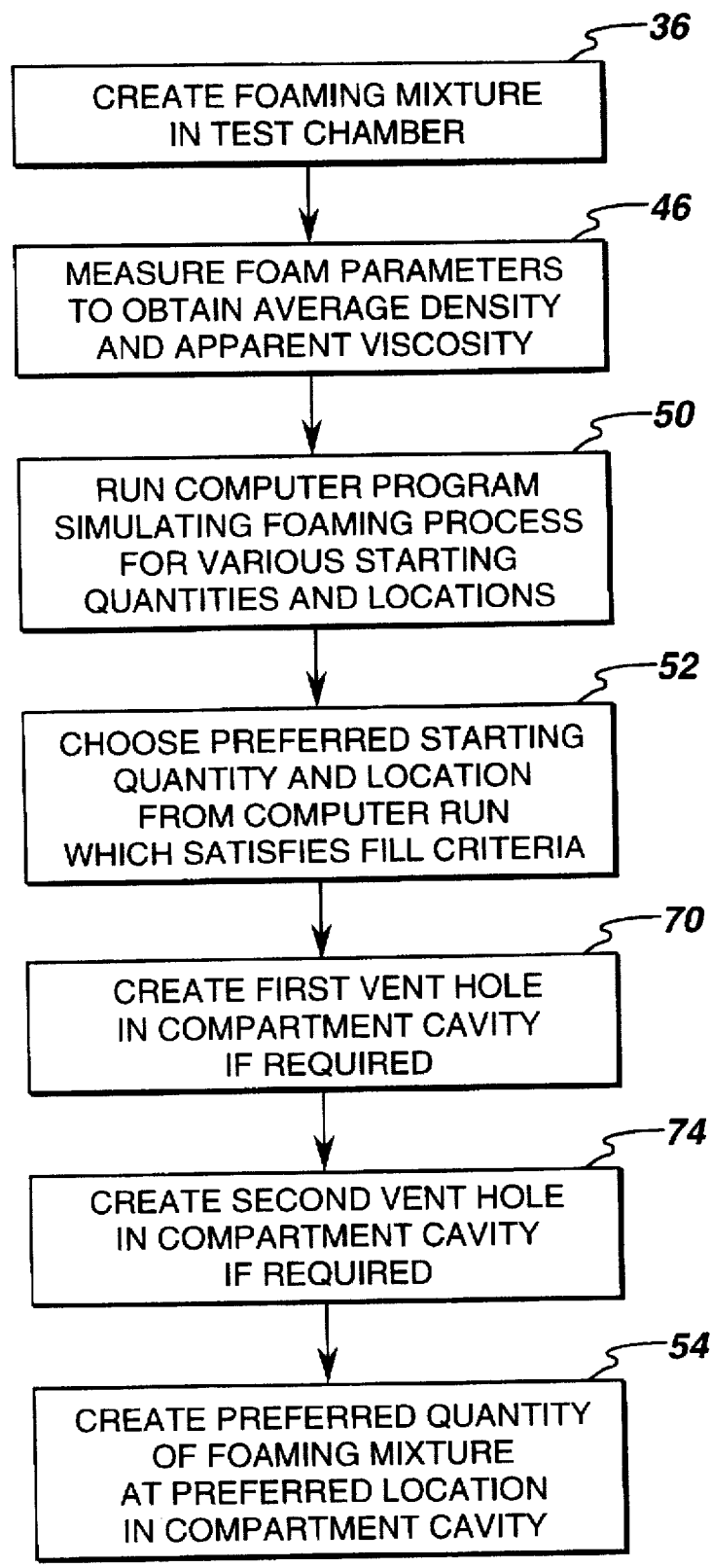
FIG. 1 is a block diagram (flow chart) of a first preferred method of the present invention for filling a compartment cavity with foam.

Referring now to the drawings, FIG. 1 shows in block diagram form a preferred method of the invention for filling a compartment cavity having a known geometry with a foam produced by an expansion and solidification of a foaming mixture of predetermined chemicals. A first preferred foam consists essentially of polyurethane foam which is produced by a mixture of liquid polyol and liquid isocyanate, as is known to those skilled in the art. It is noted, without limitation, that some foams may be produced by a mixture of a liquid and a gas or by a mixture of a solid and a liquid, etc.

Figure 2:
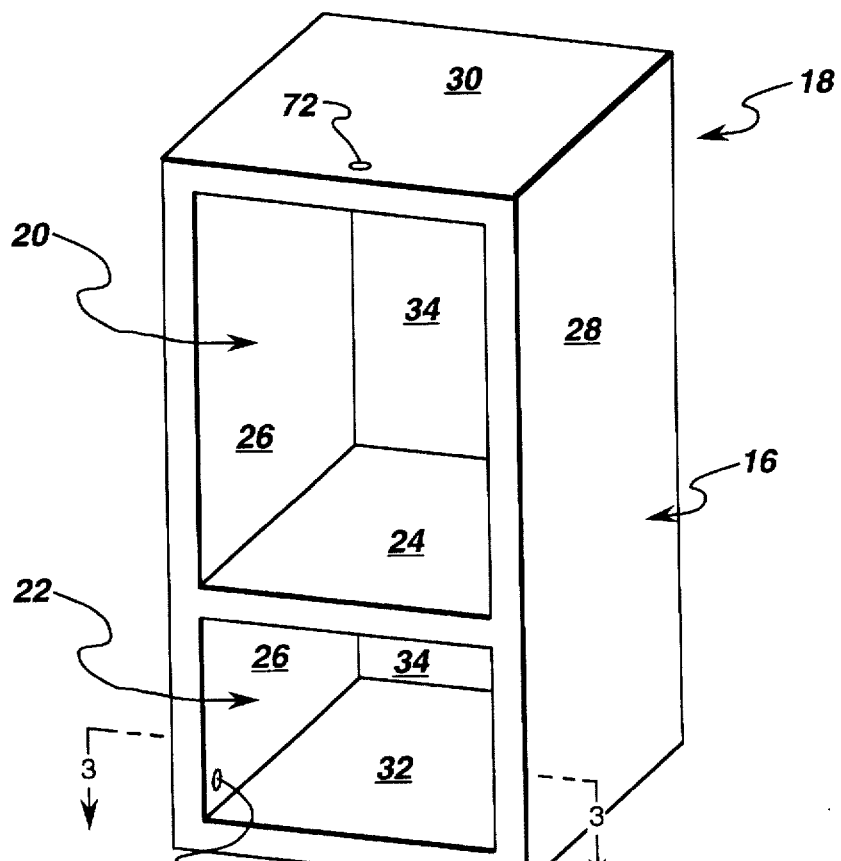
FIG. 2 is a schematic perspective view of a refrigerator cabinet having a cavity which serves as a first preferred embodiment of the compartment cavity to be filled with foam using the first preferred method shown in FIG. 1.
Figure 3:
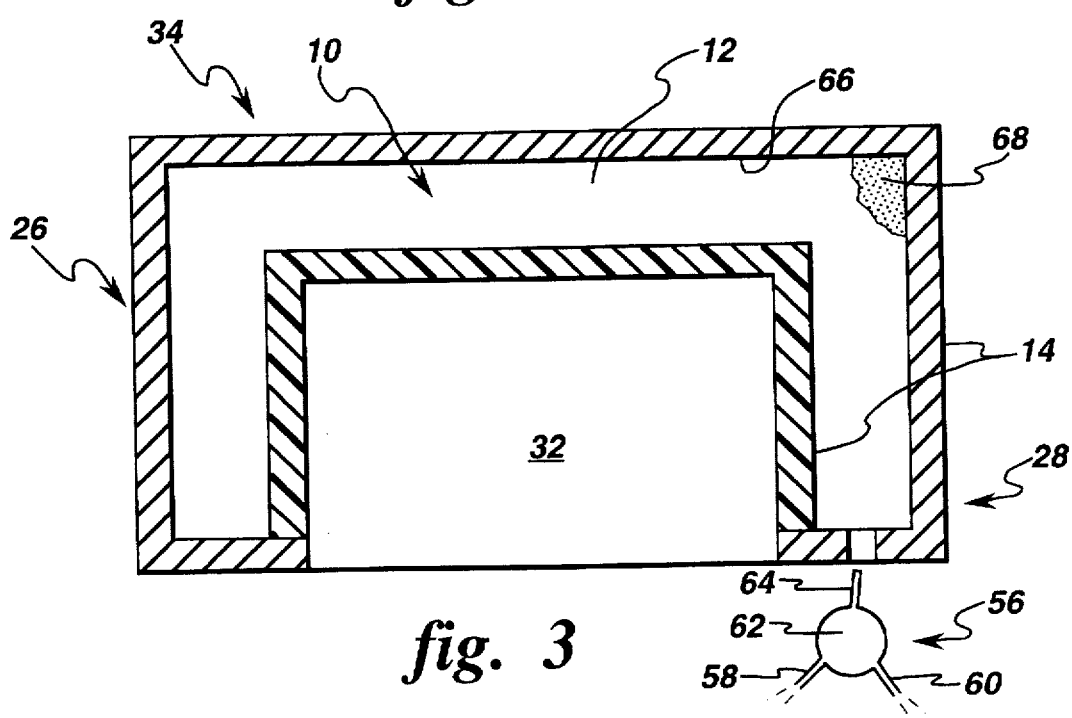
FIG. 3 is a sectional view taken along lines "3—3" in FIG. 2 also including a nozzle for mixing and injecting a quantity of the foaming mixture at a specific location in the compartment cavity.

A first preferred compartment cavity 10 to be filled with such foam using the method of the invention includes a space 12 within a double-wall 14 of a cabinet 16 of a refrigerative (i.e., cooling and/or fleezing) unit wherein the foam provides thermal insulation, and wherein a preferred refrigerative unit is a refrigerator 18 having a flesh-food section 20 and a frozen-food section 22, as shown in FIGS. 2 and 3. The cabinet 16 includes an interior rib panel 24 separating the fresh-food section 20 from the frozen-food section 22, two exterior side panels 26 and 28, an exterior top panel 30, an exterior bottom panel 32, and an exterior back panel 34. The interior rib panel 24 is attached to the exterior back panel 34 and the two exterior side panels 26 and 28, and the exterior back panel 34 is attached to the two exterior side panels 26 and 28, the exterior top panel 30, and the exterior bottom panel 32. The space 12 extends within and between the interior rib panel 24, the two exterior side panels 26 and 28, the exterior top panel 30, the exterior bottom panel 32, and the exterior back panel 34. Other compartment cavities include, without limitation, those in the building and construction market, such as the double wall of a house exterior, and those in the consumer appliances market, such as the double wall of a stove.

The basic method of the invention includes steps a) through f).

Figure 4:
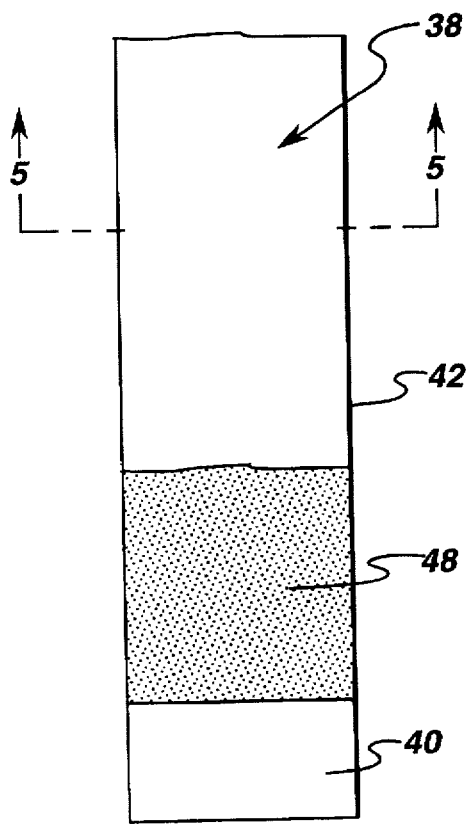
FIG. 4 is a schematic front-elevational view of a first preferred embodiment of the test-chamber cavity used in the first preferred method shown in FIG. 1.
Figure 5:
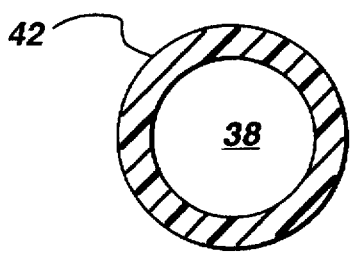
FIG. 5 is a sectional view taken along lines "5—5" in FIG. 4.
Figure 6:
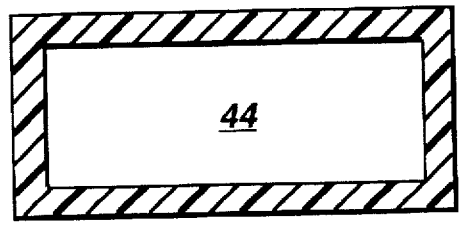
FIG. 6 is a view, as in FIG. 5, but of a second preferred embodiment of the test-chamber cavity.

Step a) is portrayed in block 36 of FIG. 1 as "Create Foaming Mixture In Test Chamber". Step a) includes creating a known amount of the foaming mixture in a test-chamber cavity 38. As shown in FIGS. 4 and 5, a first preferred test-chamber cavity 38 has a shape of a generally right-circular cylinder and includes a bottom portion and a top portion. The bottom portion is the cavity inside a mixing container 40 in which the known amount of predetermined chemicals is, for example, hand mixed. In the few seconds before the foaming process really gets underway, the mixing container 40 is mated to the bottom of a matching transparent tube 42 whose interior cavity serves as the top portion of the test-chamber cavity 38. As shown in FIG. 6, a second preferred test-chamber cavity 44 has a shape of a portion of the space within the double-wall 14 of the cabinet 16 of the refrigerative unit.

Step b) is portrayed in block 46 of FIG. 1 as "Measure Foam Parameters To Obtain Average Density And Apparent Viscosity". Step b) includes measuring as a function of time preselected parameters of the foam 48 produced by the foaming mixture created in step a) to obtain the average density and apparent viscosity of the foam 48 as a function of time. Preferably, such preselected parameters include the free surface height of the foam 48 and the pressure inside the test chamber cavity 38 at a preselected position, such preselected position preferably being near the bottom of the tube 42. In a first preferred technique, when the test chamber cavity 38 has a shape of a generally right-circular cylinder, the average density and apparent viscosity of the foam 48 are calculated from the following equations:

$$V(t) = Vmc + \pi R^2 h(t) \quad (1)$$

where:

V(t) is the volume of the foam 48 at time t,

Vmc is the volume of the mixing container 40, the mixing container 40 being the bottom portion of the test chamber cavity 38, π is 3.14159 . . . , R is the inner radius of the transparent tube 42, the tube 42 being the top portion of the test chamber cavity 38, and h(t) is the measured free surface height of the foam 48 at time t above the bottom of the tube 42 and is typically recorded by a video camera (omitted from the figures for clarity).

$$\bar{\rho}(t) = \frac{M}{V(t)} \quad (2)$$

where:

$\bar{\rho}(t)$ is the average density of the foam 48, and

M is the mass of the predetermined chemicals used to make the known amount of the foaming mixture in step a).

$$Q(t) = -\frac{V(t)}{\bar{\rho}(t)} \cdot \frac{d\bar{\rho}(t)}{dt} \quad (3)$$

where:

Q(t) is the flow rate of the foam 48 within the tube 42, and $$\frac{d\bar{\rho}(t)}{dt}$$

is the time derivative of the average density.

$$\eta(t) = \frac{\frac{P_1(t)}{h(t)} \pi R^4}{8Q(t)} \quad (4)$$

where:

η(t) is the apparent viscosity of the foam 48 at time t, and $P_1(t)$ is the measured pressure inside the test chamber cavity 38 recorded by a pressure transducer (omitted from the figures for clarity), such pressure being measured near the bottom of the tube 42.

Preferably, once the data for the average density and apparent viscosity have been calculated at different times, they are plotted as a function of time, and curve fits are generated for both data sets. Typically, the average density falls rapidly during the initial expansion phase, and then the rate at which it changes slows down. After a certain period of time, the value is assumed to be constant, and the curve fit no longer applies. Typically the viscosity data oscillates somewhat due to the average density derivative used in its calculation. Because the viscosity equation uses the pressure reading near the bottom of the tube 42 in its calculation, values cannot be calculated for the first few seconds of filling since the foam 48 has not yet reached this transducer, and no pressure readings have been taken. Therefore, the viscosity at the shortest times must be extrapolated from the calculated data. The apparent viscosity is assumed to be constant and low during the initial filling stage, while the foam 48 is still liquid. After a certain period of time, as the foam 48 begins to solidify, the apparent viscosity increases rapidly, and can be represented by the curve fit. The equations for the curve fits for the average density and the apparent viscosity are used in the next step of the method. It is noted that these empirical relationships for the average density and apparent viscosity as a function of the measured pressure and measured free surface height of the foam bypass the need to develop the complex equation of state for foaming and the equally complex equations for the rheokinetics (i.e., the rheology and reaction kinetics).

Steps c) and (d) are portrayed in block 50 of FIG. 1 as "Run Computer Program Simulating Foaming Process For Various Starting Quantities and Locations". Step c) includes running a computer program which utilizes the average density and apparent viscosity of the foam 48 as a function of time obtained in step b) to mathematically simulate the expansion of the foam 48 as a function of time of a prechosen quantity of the foaming mixture created at a prechosen location in an enclosure cavity having the same geometry as the known geometry of the compartment cavity 10.

A first preferred computer program, which can be written by those skilled in the art, programs the equations and methodology (extended to the foaming process as hereinafter explained) to model processes such as injection, compression, and resin transfer molding, such equations and methodology disclosed, for example, in the reference "Numerical Techniques for Free and Moving Boundary Problems" by H. P. Wang and H. S. Lee, *Fundamentals Of Computer Modeling for Polymer Processing*, Tucker, C. L. (ed.), Hauser Publishers, New York, 1989, pages 370–401 and in the reference "An Integrated Approach for Modeling the Injection, Compression, and Resin Transfer Molding Processes for Polymers" by Erwin W. Liang, H. P. Wang and Erin M. Perry, *Advances in Polymer Technology*, Vol. 12, No. 3, John Wiley & Sons, Inc., 1993, pages 243–262. It is noted that these processes, like the foaming process for filling compartment cavities, typically deal with thin shell-like parts in which the part thickness is much smaller than the other physical dimensions. Therefore, complex 3D (three-dimensional) geometries such as compartment cavities can be modeled as surfaces divided into small shell elements, where each element may have a slightly different thickness to account for any variations in the part thickness. Because of the thin, shell-like geometry of the parts, material flow in the thickness direction can be ignored and a thickness-averaged approach can be used for computational efficiency. The Generalized Hele-Shaw (GHS) model provides the simplified governing equations for nonisothermal, non-Newtonian flows that occur in such cavities. Details of the mathematics, including all of the governing equations, can be found in the two previously-cited references. Such details include the simultaneous solution of the pressure and temperature equations (which include the effect of preheating the cavity), because of the possible convection and viscous heating effects in the cavity-filling processes.

Extension of this finite-element-based computer program for the foaming process for filling compartment cavities requires the addition of relationships for the density and viscosity of the foaming mixture. Rather than developing the complex relationships needed to define the equation of state and the rheokinetics of the foaming mixture, a semi-empirical approach is taken in which experimentally based equations (e.g., previously-described Equations 2 and 4) for average density and apparent viscosity as a function of time are derived from measured quantities obtained from a relatively simple apparatus (e.g., that shown in FIGS. 4–6), and inserted into the necessary locations in the basic computer program.

Inputs to the computer program for the foaming process fall into three categories: part geometry, material properties, and process conditions. The part geometry is a finite element mesh representing the compartment cavity. The material properties include the average density and apparent viscosity relationships derived here (e.g., previously-described Equations 2 and 4), as well as thermal properties such as specific heat and thermal conductivity. The process conditions include the prechosen quantity of the foaming mixture and the prechosen location for this starting mixture within the compartment cavity, as well as the preheat temperature of the compartment cavity and the starting temperature (typically room temperature or cooler) of the predetermined chemicals.

One of the most important outputs from the computer program is a representation of the location of the free surface boundary of the expanding foam 48 in the enclosure cavity at successive time intervals. The output preferably is a 3D drawing of the compartment cavity that also shows contour lines, at each of the time intervals, to represent the movement of the foam throughout the cavity.

Step d) includes repeating step c) for various different prechosen quantities and various different prechosen locations. Such trial and error "experiments" are performed by the computer program. Preferably, quantities and locations are prechosen, either manually or by computer algorithm, based on the results of the previous computer run, until at least one computer run satisfies predetermined fill criteria. Such predetermined fill criteria preferably includes having a complete foam fill of the enclosure cavity (i.e., leaving no void areas) and having a uniform foam fill (i.e., having a uniform foam density). When the foaming process is not to be performed in a vacuum, providing for vent holes (to be described later) to release trapped air (or other gasses) is important, and such predetermined fill criteria preferably also includes having few isolated areas which are the last areas to be filled, such isolated areas requiring vent holes. Without such vent holes, pockets of trapped air (or other gasses) are left which can not be filled with foam.

Step e) is portrayed in block 52 of FIG. 1 as "Choose Preferred Starting Quantity and Location From Computer Run Which Satisfies Fill Criteria". Step e) includes choosing a preferred quantity and preferred location from the prechosen quantities and prechosen locations of a particular computer run from steps c) and d) which satisfies predetermined fill criteria (i.e., the predetermined fill criteria previously described in step d).

Step f) is portrayed in block 54 of FIG. 1 as "Create Preferred Quantity Of Foaming Mixture At Preferred Location In Compartment Cavity". Step f) incudes creating the preferred quantity of the foaming mixture at the preferred location in the compartment cavity 10. Preferably, as shown in FIG. 3, a nozzle 56 is provided which has two separated input lines 58 and 60 leading to a mixing chamber 62 which leads to an output spout 64. The nozzle 56 can be directed, for example, towards a particular far wall 66 of the compartment cavity 10. In the mixing chamber 62 of the nozzle 56, the preferred chemicals are mixed to produce the preferred quantity of the foaming mixture and then the gob 68 of foaming mixture is injected into the compartment cavity 10 to the preferred location before the foaming process really gets underway. It is noted that when step f) is performed in a vacuum, no vent holes are required to vent the compartment cavity 10.

When step f) is to be performed in air or in another gas or mixture of gasses, the method preferably includes, before step f), the step portrayed in block 70 of FIG. 1 as "Create First Vent Hole In Compartment Cavity If Required". This step includes creating a first vent hole 72 in the compartment cavity 10 at a first site which is last to be filled with the foam 48 as determined from the particular computer run chosen in step e). Likewise, before step f), the method preferably includes the step portrayed in block 74 of FIG. 1 as "Create Second Vent Hole In Compartment Cavity If Required". This step includes creating a second vent hole 76 in the compartment cavity 10 at a second site which is next-to-last to be filled with the foam 48 as determined from the particular computer run chosen in step e) if the second site is separated from the first site. Two sites are considered separated when the foaming process reaches a separate dead end at each of the sites.

Preferably, the starting ambient temperature of the test chamber cavity 38 in step a) is generally equal to the starting ambient temperature of the compartment cavity 10 in step f) since the viscosity of the foam 48 depends to some extent on temperature. In some applications, it is desirable to preheat the test chamber cavity 38 and the compartment cavity 10 to an identical higher temperature (e.g., at least 25 degrees Kelvin above room temperature) to increase the extent of the foaming process. Preferably, such preheat temperature is determined by running the computer program before step f) for various prechosen preheat temperatures and choosing a preferred preheat temperature which satisfies the previously-described predetermined fill criteria. The relationships for average density and apparent viscosity (e.g., previously-described Equations 2 and 4) must also be developed at these elevated temperatures by additional experiments in the test chamber cavity 38.

Applicants obtained several refrigerator cabinets that were partially filled with "short shots" (i.e., incomplete fills) of polyurethane foam using the method of the invention and then tore down the cabinets to validate the method of the invention. The foam fill in the actual cabinets was in excellent agreement with the fill predicted by the computer program. Applicants' method substantially reduces the cost of trial runs for new product introduction. It is noted that each new foam chemistry must go through steps a) through f) of the method of the invention, whereas each new compartment-cavity geometry need go through only steps c) through f) of the method of the invention.

The foregoing description of several preferred methods of the invention has been presented for purposes of illustration. It is not intended to be exhaustive or to limit the invention to the precise methods disclosed, and obviously many modifications and variations are possible in light of the above teaching. It is intended that the scope of the invention be defined by the claims appended hereto.

We claim:

1. A method for filling a compartment cavity having a known geometry with a foam produced by an expansion and solidification of a foaming mixture of predetermined chemicals, said method comprising the steps of:

a) creating a known mount of said foaming mixture in a test-chamber cavity;

b) measuring as a function of time preselected parameters of said foam produced by said foaming mixture created in step a) to obtain the average density and apparent viscosity of said foam as a function of time;

c) running a computer program which utilizes the average density and apparent viscosity of said foam as a function of time obtained in step b) to mathematically simulate the expansion of said foam as a function of time of a prechosen quantity of said foaming mixture created at a prechosen location in an enclosure cavity having the same geometry as the known geometry of said compartment cavity;

d) repeating step c) for various different prechosen quantities and various different prechosen locations;

e) choosing a preferred quantity and preferred location from the prechosen quantities and prechosen locations of a particular computer run from steps c) and d) which satisfies predetermined fill criteria; and f) creating said preferred quantity of said foaming mixture at said preferred location in said compartment cavity.

2. The method of claim 1, also including before step f), the step of creating a first vent hole in said compartment cavity at a first site which is last to be filled with said foam as determined from said particular computer run chosen in step e).

3. The method of claim 2, also including before step f), the step of creating a second vent hole in said compartment cavity at a second site which is next-to-last to be filled with said foam as determined from said particular computer run chosen in step e) if said second site is separated from said first site.

4. The method of claim 1, wherein said foam consists essentially of polyurethane foam.

5. The method of claim 1, wherein said computer program produces an output representing the location of the free surface boundary of said foam in said enclosure cavity at successive time intervals.

6. The method of claim 1, wherein said test-chamber cavity has a shape of a generally right-circular cylinder.

7. The method of claim 6, wherein said preselected parameters measured in step b) include the free surface height of said foam and the pressure inside said test chamber cavity at a preselected position.

8. The method of claim 1, wherein said compartment cavity includes a space within a double wall of a cabinet of a refrigerative unit.

9. The method of claim 8, wherein said test-chamber cavity has a shape of a portion of said space.

10. The method of claim 8, wherein said refrigerative unit is a refrigerator having a fresh-food section and a frozen-food section; wherein said cabinet includes an interior rib panel separating said fresh-food section from said frozen-food section, two exterior side panels, an exterior top panel, an exterior bottom panel, and an exterior back panel; wherein said interior rib panel is attached to said exterior back panel and said two exterior side panels; wherein said exterior back panel is attached to said two exterior side panels, said exterior top panel, and said exterior bottom panel; and wherein said space extends within and between said interior rib panel, said two exterior side panels, said exterior top panel, said exterior bottom panel, and said exterior back panel.

11. The method of claim 1, wherein said computer program also utilizes a preheat temperature of said test-chamber cavity to mathematically simulate the expansion of said foam, and also including before step f), the steps of running said computer program for various prechosen preheat temperatures, choosing a preferred preheat temperature which satisfies said predetermined fill criteria, and preheating said compartment cavity to said preferred preheat temperature.

* * * * *